United States Patent [19]
Duong et al.

[11] Patent Number: 5,675,262
[45] Date of Patent: Oct. 7, 1997

[54] FAST CARRY-OUT SCHEME IN A FIELD PROGRAMMABLE GATE ARRAY

[75] Inventors: Khue Duong; Stephen M. Trimberger, both of San Jose; Bernard J. New, Los Gatos, all of Calif.

[73] Assignee: Xilinx, Inc., San Jose, Calif.

[21] Appl. No.: 548,775

[22] Filed: Oct. 26, 1995

[51] Int. Cl.$^6$ .................................................. H03K 19/177
[52] U.S. Cl. ............................................. 326/41; 326/40
[58] Field of Search .................................. 326/39, 40, 41

[56] References Cited

U.S. PATENT DOCUMENTS

| | | |
|---|---|---|
| 5,260,611 | 11/1993 | Cliff et al. ................................. 326/39 |
| 5,267,187 | 11/1993 | Hsieh et al. .............................. 364/784 |
| 5,359,242 | 10/1994 | Veenstra ................................... 326/39 |
| 5,450,021 | 9/1995 | Chiang ..................................... 326/39 |
| 5,481,206 | 1/1996 | New et al. ................................ 326/39 |

*Primary Examiner*—Edward P. Westin
*Assistant Examiner*—Benjamin D. Driscoll
*Attorney, Agent, or Firm*—Wagner, Murabito & Hao; Jeanette S. Harms

[57] ABSTRACT

A fast carry-out scheme in a field programmable logic array. The configurable logic blocks (CLBs) are arranged in columns. The carry-out signals are routed from the bottom CLB of a column to the top CLB of that column. The carry-out from the top-most CLB is then multiplexed onto a clock line that is normally used to conduct clocking signals to the CLBs. Instead of conducting clocking signals, the existing clock line is now used to route the carry-out signal onto a vertical longline spanning the entire height of the column. Eventually, the carry-out signal is routed from the longline to its destination CLB of the adjacent column via local interconnect resources.

18 Claims, 6 Drawing Sheets

FAST CARRY-OUT SCHEME IN A FIELD PROGRAMMABLE GATE ARRAY

FIELD OF THE INVENTION

The present invention pertains to a fast carry-out scheme for use in a field programmable gate array that is configured as an adder.

BACKGROUND OF THE INVENTION

Integrated circuit (IC) semiconductor chips are the critical components found in virtually all modern telecommunications, computer, and electronics products. Many of these semiconductor chips are custom-made and tailored to the exact specifications supplied by the designers. However, these custom chips can be quite expensive to produce, and thus not ideally suited for those instances where only a limited quantity of chips are desired. Furthermore, it can take quite a long time to fabricate these custom chips. In today's competitive environment, time-to-market is of utmost importance. Moreover, if there is an error somewhere in the initial design or layout, more delays are incurred in fixing the problems.

In response to the shortcomings inherent to custom IC chips, field-programmable gate arrays (FPGAs) were developed. An FPGA is a standard off-the-shelf semiconductor chip that can be individually programmed to perform the desired functions. FPGAs can be reprogrammed an unlimited number of times and can be used in innovative designs where hardware is changed dynamically, or where hardware must be adapted to different user applications. An FPGA is typically comprised of three major configurable elements: configurable logic blocks (CLBs), input/output blocks (IOBs), and an interconnect network. The CLBs provide the functional elements for constructing the desired logic. The IOBs provide the interface between the package pins and internal signal lines. And the interconnection resources provide routing paths, programmable intersection points, and switch matrices to transfer the input and output signals of the CLBs and IOBs onto the appropriate networks.

Oftentimes, FPGAs are used as adders, subtracters, and accumulators. Combinational (i.e., parallel) adders, subtracters, or accumulators can be designed by cascading a number of CLBs. Each CLB acts as a full adder by accepting one bit of each operand and an incoming carry. The CLB includes two function generators each of which can produce any function of at least three inputs, one function generator produces the sum and one produces the outgoing carry. In this manner, a 16-bit function can be fashioned from 16 CLBs. However, to provide this function, sixteen CLB delays are incurred.

To solve this problem, a faster embodiment implements addition two bits at a time. In this embodiment, three CLBs can each handle two input bits of operand and an input carry to generate the two sum outputs and an outgoing carry. Hence, a 16-bit function requires 24 CLBs, but the operation is completed in just eight CLB delays. For faster operation, a look-ahead carry technique can be used. A look-ahead approach uses carry propagate and carry generate signals to reduce the ripple-carry delay. Consequently, a 16-bit addition can be completed in five CLB delays by using 30 CLBs. In an even faster approach, using a conditional-sum adder, sixteen bits can be added in only three CLB delays by using 41 CLBs.

In virtually all of these designs, the carry-out path is the critical path because it has the tightest timing requirements. The goal, then, is to minimize the propagation delay associated with routing the carry-out signal. One area of the critical path in which a great amount of propagation delay is incurred, relates to the way that the carry-out signal is routed in the CLB array. Typically, the carry-out from one CLB is hardwired as an input to the CLB that is directly above it. In other words, the carry-out signal is propagated from the bottom-most CLB of a column of CLBs and ascends through each of the CLBs, until it reaches the top-most CLB of that column. At that point, the carry-out signal is selected as an input to one of the function generators of the CLB. That function generator is programmed to perform the function of a buffer to drive the carry-out signal onto the interconnect network so that the carry-out signal may be routed to the bottom of another column of CLBs.

Consuming an entire function generator just to drive the carry-out signal onto an adjacent CLB column is quite costly, but may be justified because it does not unduly load the critical path with superfluous circuitry (i.e., does not slow down the critical path). Another technique might be to use dedicated buffers to route the carry-out signal directly onto the interconnect lines. However, the additional buffers that are required to implement this technique would undesirably increase the die size. Increasing the die size translates into higher costs because less dies (i.e., less chips) could be fabricated from a given wafer. Thus, a need arises for a fast, efficient, and more economical scheme for propagating the carryout signals among the CLBs of an FPGA.

SUMMARY OF THE INVENTION

The present invention pertains to a fast carry-out scheme in a field programmable logic array. The FPGA has an array of configurable logic blocks (CLBs) which are arranged in rows and columns. Several CLBs can be programmed to perform addition or subtraction functions. This is accomplished by inputting two or more operands into a CLB which then generates a carry-out signal based thereon. Since the carry-out signal is the critical path, it is important to route the carry-out signals as quickly as possible. The carry-out signals are routed from the bottom CLB of a column, through each of the intervening CLBs, to the top CLB of that column in ascending order. The carry-out from the top-most CLB is then multiplexed onto a clock line that is normally used to conduct clocking signals to various CLBs. Instead of conducting clocking signals, the existing clock line in accordance with the present invention routes the carry-out signal onto a vertical long line spanning the entire height of the column. Eventually, the carry-out signal is routed from the long line to a destination CLB of an adjacent CLB column via local interconnect resources.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
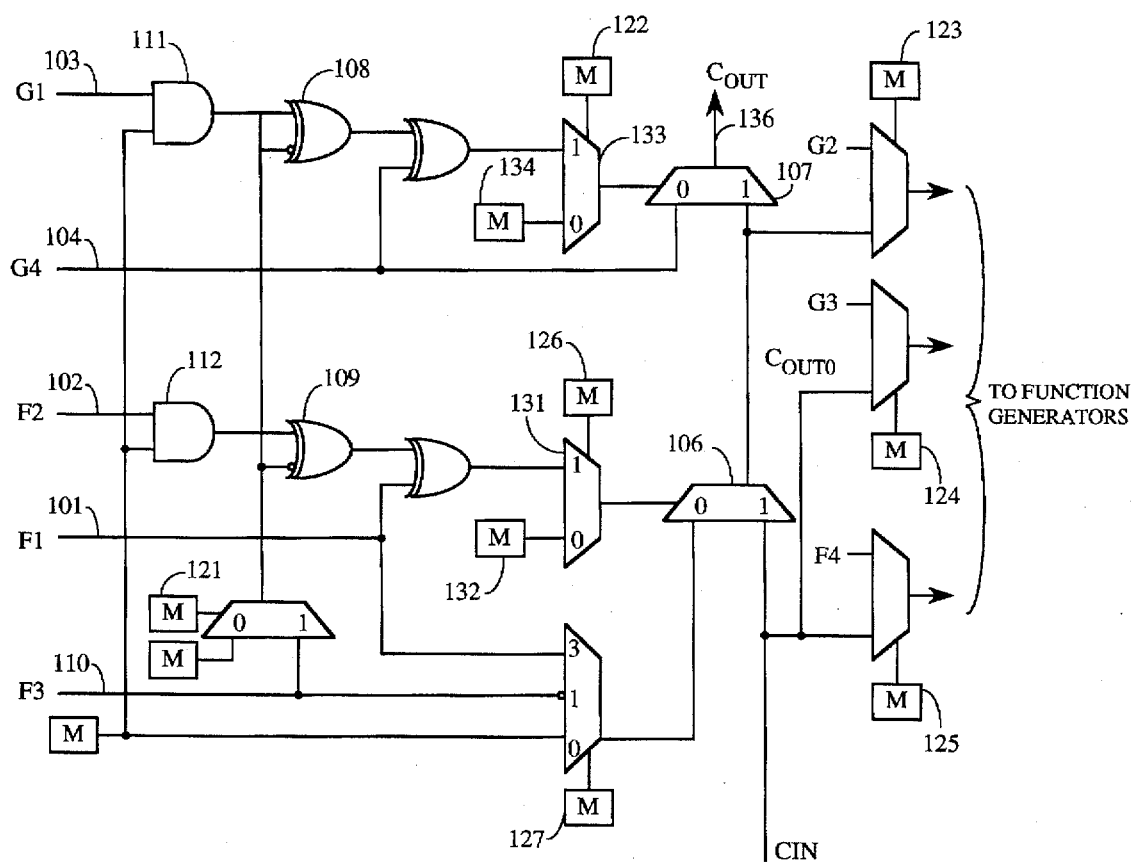
FIG. 1 illustrates a circuit diagram of one embodiment of the present invention in which a CLB performs the function of dedicated carry logic.

Carry logic circuits are well known in the art. FIG. 1 shows a circuit diagram of one embodiment in which a CLB performs the function of dedicated carry logic for a two-bit adder which adds two bits (Ai and Ai+1) to two other bits (Bi and bi+1). First, the A and B input signals on the F1 (Ai), F2 (Bi), G1 (Ai+1), and G4 (Bi+1) lines (i.e. lines 101–104) are compared. If these signals are equal, the carry out signal COUT is well-defined without reference to the carry in signal CIN. Specifically, if both input signals are "zero", carry is not propagated and no carry is generated. Consequently, COUT must be zero. On the other hand, if both input signals are "one", a carry is generated, and COUT must also be a one. Thus, in either case, COUT is equal to the A input signal. If, however, the A and B input signals are different, then the carry is propagated and COUT is the same as CIN. Hence, COUT can be created by multiplexing the A input signal and CIN. This scheme is used because multiplexers 106 and 107 in the ripple path are typically implemented using pass transistors, which introduce the least cumulative delay into this critical path compared to other methods including restoring to build the AND-OR structure of the multiplexer.

XOR gates 108 and 109 are provided as polarity controls for the B operands. According to a configuration bit 121, the B operands are inverted for a subtracter or not inverted for an adder. A number of configuration bits are stored in memories 121–127 for controlling their respective multiplexers. Alternatively, the polarity may be controlled by F3 line (line 110) for an adder/subtracter. The B operands may be gated out using a configuration bit in conjunction with two AND gates 111 and 112 so that add and subtract can become increment and decrement. U.S. Pat. No. 5,267,187, issued Nov. 30, 1993 to Hsieh et al., describes the operation of this embodiment (excluding memory cells 123–125 and their associated multiplexers) of a carry logic circuit in greater detail, and is incorporated by reference herein.

It should be noted that the configuration bit in memory 126 can control multiplexer 131 to force a constant value stored in memory 132 onto COUT0 line 135. For example, the signal on the F2 line 102 can be forced onto COUT0 line 135. Similarly, the signal on the G4 line 104 may be forced onto COUT line 136 by setting the configuration bit of memory 122 so that multiplexer 133 selects the bit stored in memory 134. In this manner, multiplexer 107 selects the G4 line 104 to be electrically coupled to the COUT line 136.

Figure 2:
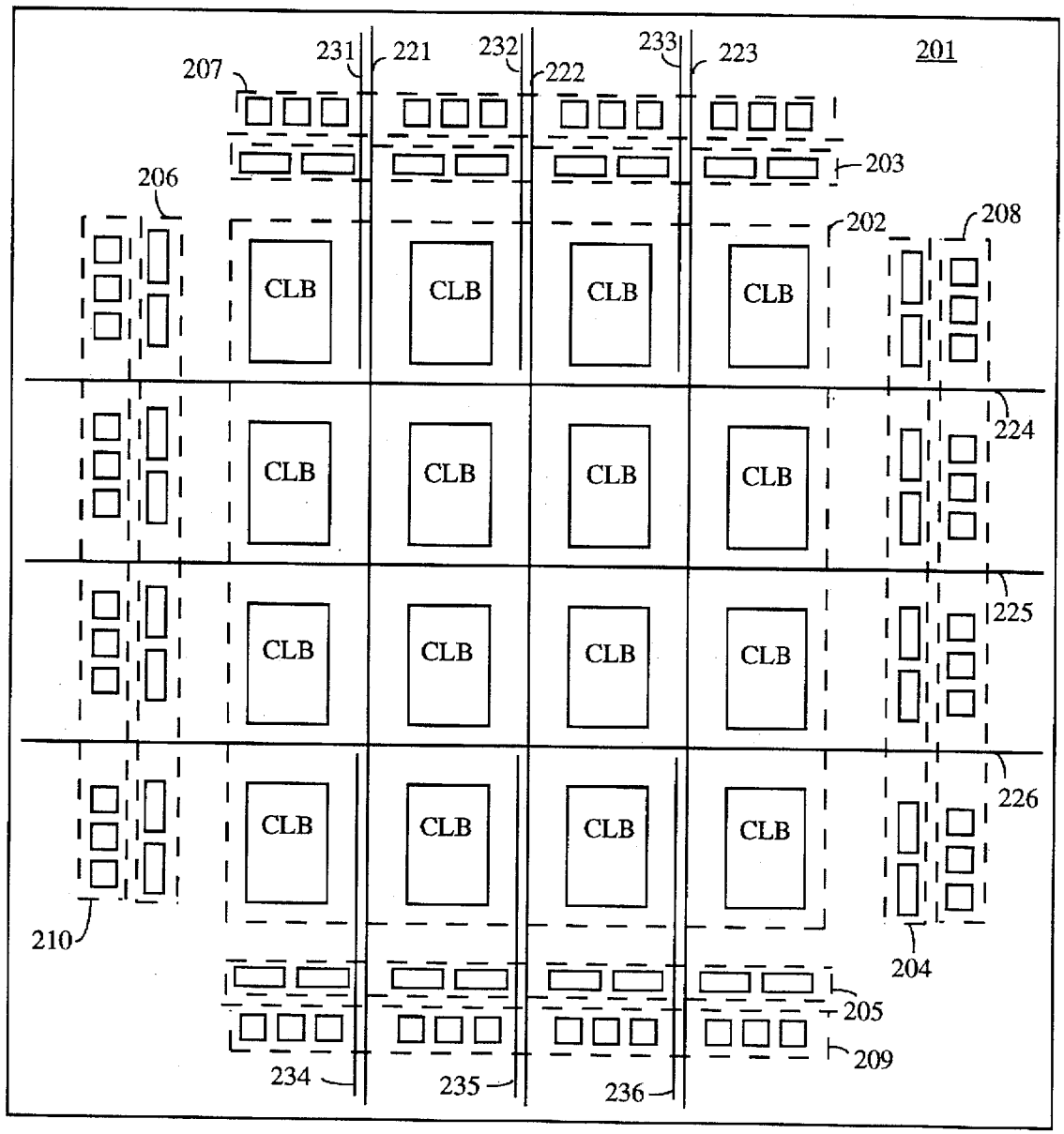
FIG. 2 shows a block diagram of an FPGA layout.

FIG. 2 shows a block diagram of an FPGA 201 including a 4×4 CLB array 202. Note that an FPGA design can have an 8×8, 10×10, 12×12, 14×14, 16×16, 18×18, 20×20, 24×24, 28×28, 32×32etc. CLB matrix. Consequently, there may be as few as 16 or as many as 1,024 plus CLBs contained within an FPGA chip. The present invention can be applied to suit any CLB matrix size. A CLB can include multiple elements, such as function generators, flip-flops, buffers, drivers, multiplexers, registers, etc. The present invention can be applied equally to any kind of CLB configuration. Surrounding CLB array 202 are IOBs 203–206 and decoders 207–210.

In one embodiment of the present invention, the CLBs, IOBs, and decoders are programmably interconnected by the use of three main types of interconnect lines. These interconnect lines are distinguished by the relative length of their segments: single-length lines, double-length lines, and long lines. The single-length lines are comprised of a grid of horizontal and vertical metal lines that intersect at switch matrices (not shown) between each CLB. The switch matrices are used to establish connections between the single-length lines. The double-length lines (also not shown) consist of a grid of metal segments that are twice as long as the single-length lines. Hence, a double-length line runs past two CLBs before entering a switch matrix.

Long lines 221–226 form a grid of metal interconnect segments that substantially run the length or width of FPGA 201. These horizontal and vertical long lines, which bypass the switch matrices, are intended primarily for signals that must travel a long distance, or must have minimum skew among multiple destinations. In one embodiment, each of long lines 221–226 have four bi-directional buffers. These buffers can be programmed to separate a long line into four independent segments. Each of these segments can bi-directionally conduct its own signal.

U.S. patent application Ser. No. 08/548,791, entitled "SEGMENTED BI-DIRECTIONALLY DRIVEN INTERCONNECT LINES IN A FIELD PROGRAMMABLE GATE ARRAY" (Attorney Docket No. X-219), which is incorporated by reference herein, describes these bi-directionally driven interconnect lines in further detail. FIG. 2 illustrates a plurality of clock lines 231–236 that run a quarter of the length of CLB array 202. In the prior art, these clock lines are primarily used to conduct clocking signals from IOBs 203 and 205 to the CLBs. However, in accordance with the present invention, clock lines 231–236 are used in conjunction with the long lines to route the carry-out signal.

Figure 3:
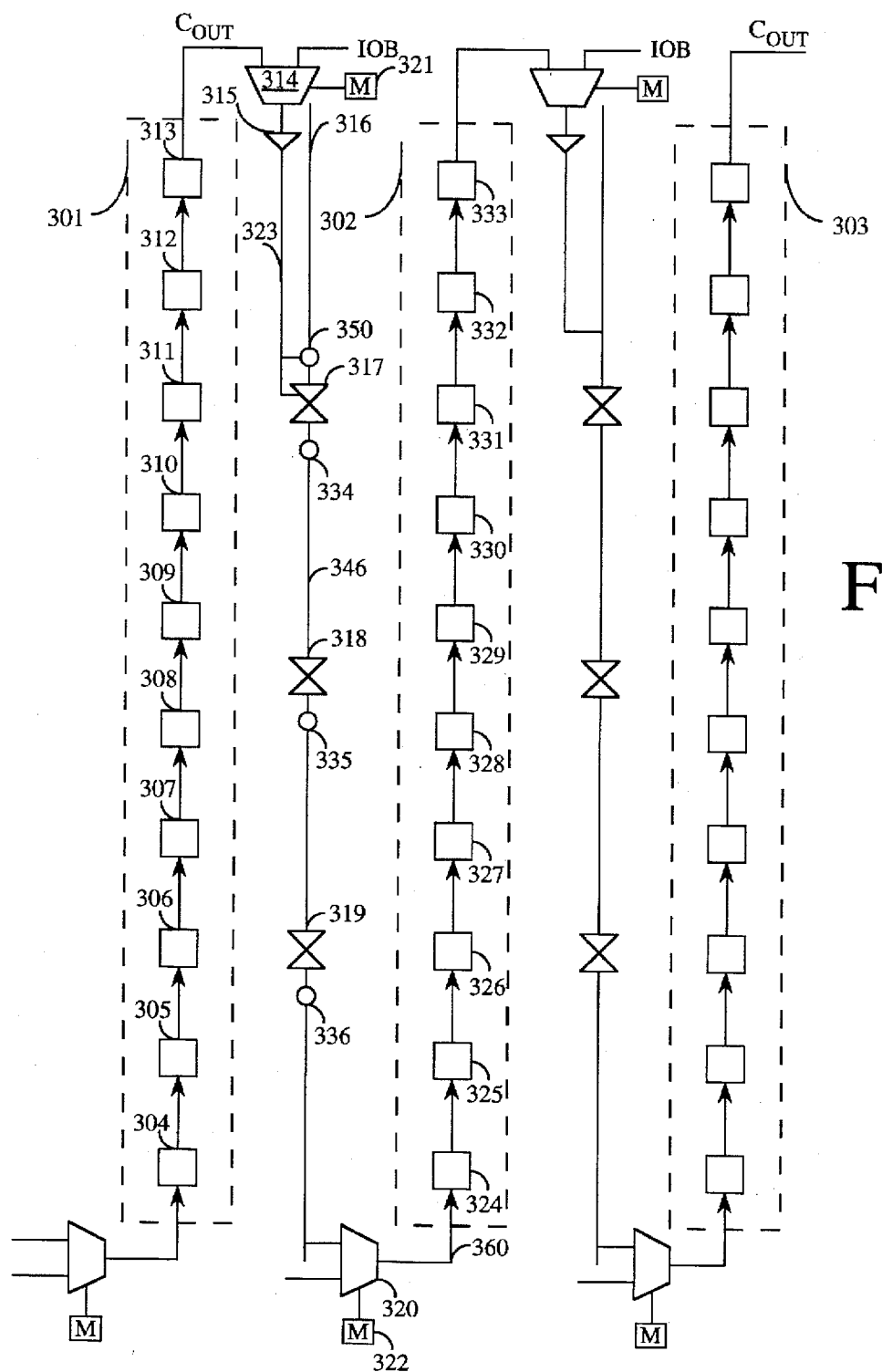
FIG. 3 illustrates one structure for routing a carry-out signal from one CLB column to another CLB column.

FIG. 3 shows a structure for routing the carry-out signal from one CLB column to another CLB column. Three CLB columns 301–303 are shown. Assume CLB 304 adds/subtracts two operands and generates a carry-out signal COUT. The carry-out signal COUT from CLB 304 is then routed to the CLB directly above it, i.e. CLB 305. CLB 305 adds/subtracts two operands based on the COUT signal from CLB 304 and generates its COUT signal, which is then routed to CLB 306. This process is repeated for CLBs 306–313. The COUT signal generated by CLB 313 is provided to a multiplexer 314. A configuration bit stored in memory 321 directs multiplexer 314 to route either the COUT signal from CLB 313 or a clocking signal from one of the IOBs to a clock source line 323 which runs one-quarter of the length of CLB array 202 (FIG. 2). Clock source line 323 is coupled to vertical long line 316 via a programmable interconnect point (PIP) 350. In an alternative embodiment, clock source line 323 is coupled to an input terminal of a second multiplexer (not shown) before being routed to long line 316. In the alternative embodiment, the multiplexer selects the signals on clock source line 323 or any one of a plurality of other signals to be routed onto long line 316. In another embodiment, clock source line 323 and long line 316 are multiplexed together, wherein the multiplexer output signal sources the downward-driving configuration of bi-directional buffer 317 onto longline segment 346. A more detailed description of this configuration is provided below and also provided in U.S. patent application Ser. No. 08/548,926, assigned to the assignee of the present invention and entitled "Tri-Directional Buffer," which is incorporated herein by reference.

In the embodiment of FIG. 3, long line 316 has three bi-directional drivers 317–319 that drive the COUT signal to a multiplexer 320. Based on the configuration bit in memory 322, multiplexer 320 selects one of several signals to be provided to CLB 324 via line 360. Alternatively, the COUT signal may exit long line 316 via any of PIPs 334–336 onto the local interconnect network (not shown) which includes vertical and horizontal interconnect lines, PIPs, and switch matrices. The long lines include PIPs to drive the signal directly into CLBs 324–333 so that the carry signal may propagate upward through the column of CLBs. The local interconnect network can be programmed to route the COUT signal to one of CLBs 324–333 or 304–313. The COUT signal propagation is repeated for CLBs 324–333 of column 302. It is much faster to route the COUT signal first through the clock source line 323 to long line 316, and then to the local interconnect to the final destination, rather than directly onto the interconnect network. It should be noted that the present invention applies as well to different length lines, buffer configurations, and interconnect layouts.

Figure 4:
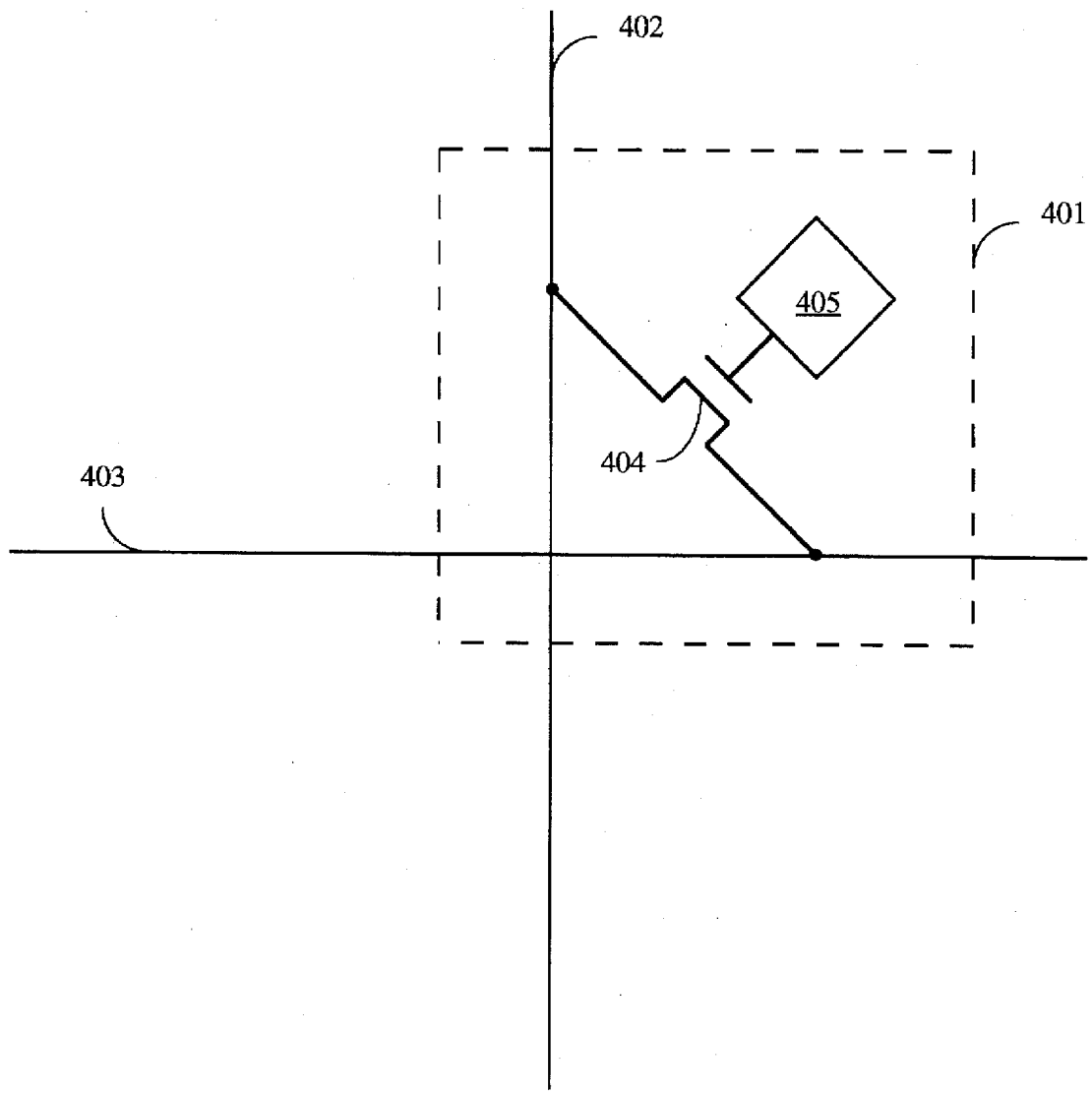
FIG. 4 shows an exemplary programmable interconnect point.

FIG. 4 shows an exemplary programmable interconnect point which includes a pass transistor 404 having its gate coupled to a programmable memory cell 405. Memory cell 405 can be programmed to contain information that either turns on or turns off transistor 404. If turned or programmed ON, transistor 404 electrically connects lines 402 and 403. If turned or programmed OFF, transistor 404 does not connect lines 402 and 403.

Figure 5:
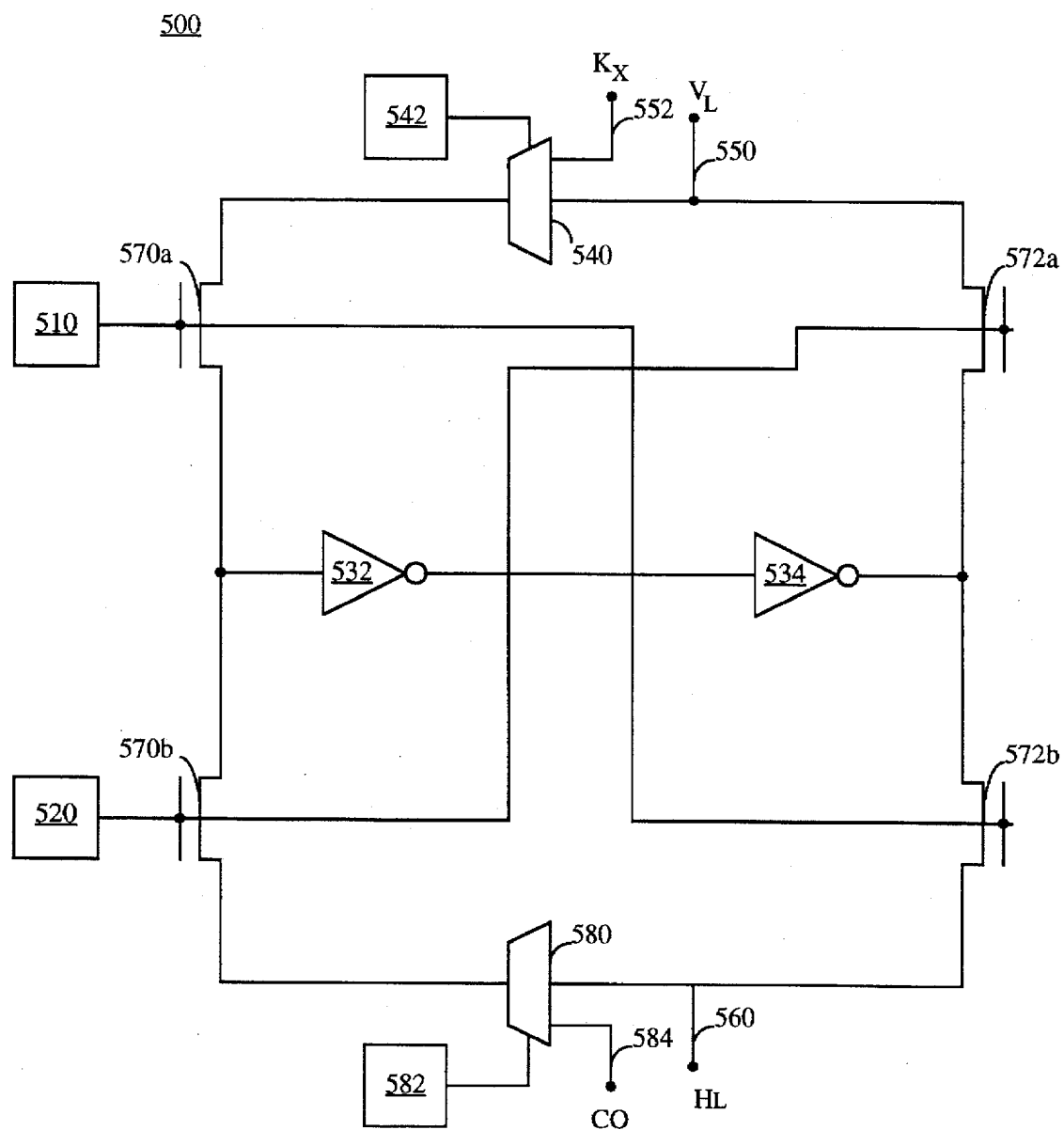
FIG. 5 shows a bi-directional, multiple-source buffer circuit, which can be used to buffer and drive the various signals of the present invention.

FIG. 5 shows a multi-directional, multiple-source buffer circuit 500, which can be used to buffer and drive the various signals of the present invention. The circuit 500 allows a signal over line 584 or over line 560 to be sourced, buffered by circuits 532, 534 and driven over line 550. Multiplexer 580 provides the selection between lines 584 and 560 as the source of the signal. When memory cell 582 of FIG. 5 is programmed such that multiplexer 580 selects the HL input/output line 560 as input, and memory cell 510 contains a "0" and memory cell 520 contains a "1," then transistor 570b is ON, transistor 572a is ON and transistors 570a and 572b are OFF. This configuration allows a signal entering over line 560 to be buffered by buffer circuits 532 and 534 and output over input/output line 550. The value of memory cell 542 is ignored in this configuration.

Figure 6:
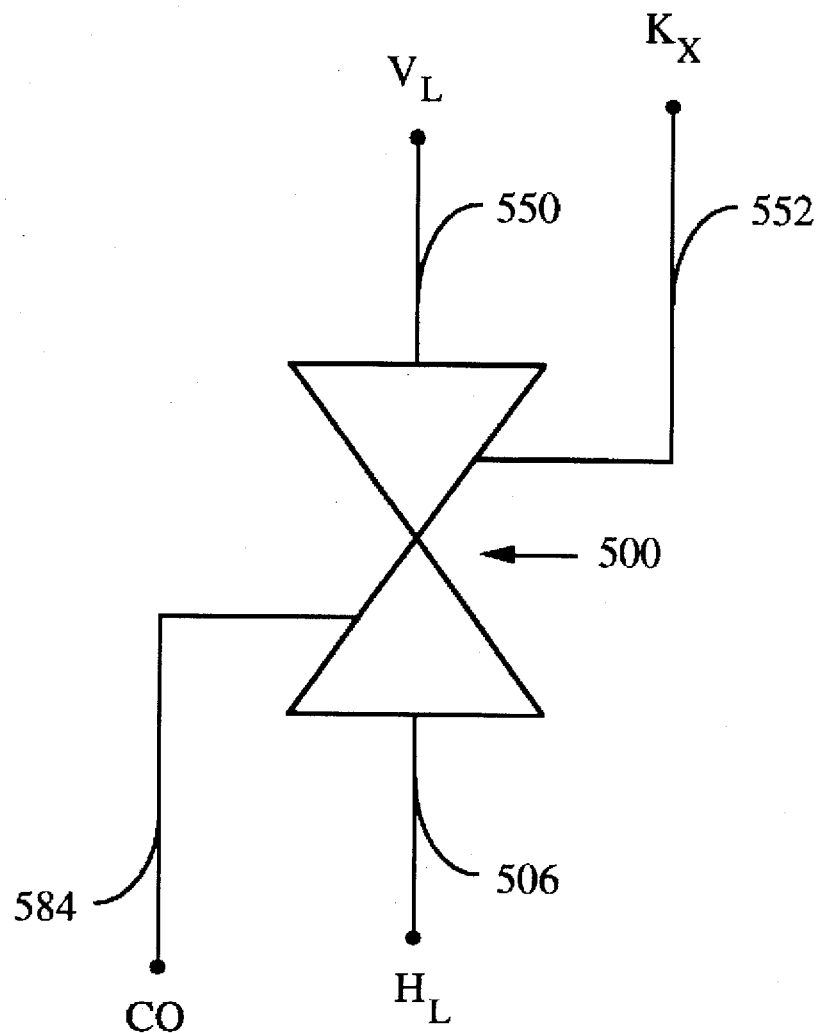
FIG. 6 is a logical block diagram of the bi-directional, multiple-source buffer circuit illustrating the auxiliary input signal, the auxiliary input signal, the input/output line, and the input/output line.

FIG. 6 is a logical block diagram of the circuit 500 of FIG. 5 illustrating the auxiliary input signal 552, the auxiliary input signal 584, the input/output line 550, and the input/output line 560. There are a number of well known methods and procedures that can be used within the scope of the present invention to program the memory cells 542, 510, 520, and 582 of circuit 500 to allow selection of either line 552 or line 550 as the source input or to allow selection of either line 584 or line 560 as the source input. Table I below illustrates an exemplary truth table.

TABLE I

| Cell 582 | Cell 542 | Cell 510 | Cell 520 | Configuration |
|---|---|---|---|---|
| X | 0 | 1 | 0 | Drive from 550 to 560 |
| X | 1 | 1 | 0 | Drive from 552 to 560 |
| 0 | X | 0 | 1 | Drive from 560 to 550 |
| 1 | X | 0 | 1 | Drive from 584 to 550 |
| X | X | 0 | 0 | Open Circuit |

X = Don't Care

When memory cell 582 of FIG. 5 is programmed such that multiplexer 580 selects the CO input line 584 as input, and memory cell 510 contains a "0" and memory cell 520 contains a "1," then transistor 570b is ON, transistor 572a is ON and transistors 570a and 572b are OFF. This configuration allows a signal entering over line 584 to be buffered by buffer circuits 532 and 534 and output over input/output line 550. The value of memory cell 542 is ignored in this configuration.

When memory cell 510 contains a "1" and memory cell 520 contains a "0," then transistor 570a is ON, transistor 572b is ON and transistors 570b and 572a are OFF. This allows a signal entering over line 550 or line 552 (depending on the state of memory cell 542) to be buffered by buffer circuits 532 and 534 and output over input/output line 560. In this configuration, the state of the memory cell 582 is ignored.

Circuit 500 of FIG. 5 is multi-directional because either input line 584 or input/output line 560 can be sourced, buffered by circuits 532 and 534, and driven over input/output line 550. In this way, an auxiliary signal over line 584 (e.g., a carry out signal) can be buffered by circuit 500. Circuit 500 also allows a signal input over 550 or 552 to be buffered by circuits 532 and 534 and output over line 560.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention only be defined by the claims appended hereto and their equivalents.

What is claimed is:

1. A field programmable gate array comprising:
   an array of configurable logic blocks which can be programmed to perform addition functions, wherein a configurable logic block generates a carry-out signal based on two operand signals;
   a long line spanning the array of configurable logic blocks for conducting signals;
   a plurality of interconnect lines coupled to the long line for routing signals on the long line to configurable logic blocks;
   a clock line coupled to the long line for routing a clock signal to the long line and to the plurality of interconnect lines;
   a multiplexer coupled to one of the configurable logic blocks for selectively conducting either the carry-out signal or the clock signal onto the clock line, wherein if the carry-out signal is selected, the carry-out signal is routed from the configurable logic block to the clock line, from the clock line to the long line, from the long line to the interconnect lines, and from the interconnect lines to a destination configurable logic block.

2. The field programmable gate array of claim 1 further comprising at least one bi-directional driver coupled to the long line for driving the carry-out signal.

3. The field programmable gate array of claim 2 further comprising a plurality of programmable interconnection points coupled to the long line for electrically coupling the carry-out signal to the interconnect lines at various locations.

4. The field programmable gate array of claim 3, wherein the long line is a vertical long line.

5. The field programmable gate array of claim 3, wherein the clock line is a vertical long line extending approximately one-quarter of the height of the array of configurable logic blocks.

6. The field programmable gate array of claim 1, wherein the configurable logic block coupled to the multiplexer is a top-most configurable logic block of a first column of configurable logic blocks and the destination configurable logic block is a bottom-most configurable logic block of a second column of configurable logic blocks that is adjacent to the first column.

7. The field programmable gate array of claim 1, wherein the configurable logic block is comprised of:

a first multiplexer that selects between an intermediate carry-out signal and one of the operand signals for output as the carry-out signal;

a second multiplexer coupled to the first multiplexer, wherein the second multiplexer selects between a configuration bit stored in memory and a result of a logic function performed on a plurality of the operand signals, wherein the output of the second multiplexer controls the first multiplexer.

8. A programmable logic device that is capable of being programmed to perform addition functions, comprising:

a first column of configurable logic blocks (CLBs), wherein a bottom CLB of the first column generates a carry-out signal that is propagated to a top CLB of the first column;

a second column of CLBs having a bottom CLB corresponding to the second column and a top CLB corresponding to the second column;

a first line running in-between the first column and the second column, wherein the first line either conducts a clock signal or the carry-out signal from the top CLB of the first column;

a second line spanning the height of the first and second columns and running in-between the first column and the second column, wherein the second line conducts either the clock signal or the carry-out signal from the top CLB;

an interconnect line coupled to the second line and coupled to the bottom CLB of the second column, wherein the interconnect line routes either the clock signal or the carry-out signal from the second line to the bottom CLB of the second column.

9. The programmable logic device of claim 8 further comprising:

a multiplexer coupled to the top CLB of the first column that selects either the carry-out signal or the clock signal;

a driver coupled to the multiplexer that drives either the carry-out signal or the clock signal onto the first line.

10. The programmable logic device of claim 8, wherein the first line is a clock line and the second line is a vertical long line.

11. The programmable logic device of claim 8 further comprising a plurality of bi-directional drivers for driving signals on the second line.

12. The programmable logic device of claim 8 further comprising a programmable interconnect point for electrically coupling the second line to the interconnect line.

13. The programmable logic device of claim 8, wherein the top configurable logic block is comprised of:

a first multiplexer that selects between an intermediate carry-out signal and an operand signal for output as the carryout signal;

a second multiplexer coupled to the first multiplexer, wherein the second multiplexer selects between a configuration bit stored in memory and a result of a logic function performed on a plurality of operand signals, wherein the output of the second multiplexer controls the first multiplexer.

14. In a field programmable gate array, a method of routing a carry-out signal from a top configurable logic block (CLB) of a first column of CLBs to a bottom CLB of an adjacent second Column of CLBs, the method comprising the steps of:

selecting between the carry-out signal and a clock signal, wherein if the carry-out signal is selected:

driving the carry-out signal onto a clock line running in between the first column and the second column;

switching the carry-out signal from the clock line to a vertical line running at least the height of the first column of CLBs;

switching the carry-out signal from the vertical line to an interconnect line that is coupled to the bottom CLB of the second column.

15. The method of claim 14 further comprising the step of bi-directionally driving the carry-out signal on the vertical line.

16. The method of claim 14 further comprising the step of the top CLB directly conducting an operand signal to a carry-out line.

17. The method of claim 14 further comprising the steps of:

storing a configuration bit in memory;

multiplexing between the configuration bit stored in the memory and a result of a logic function performed on a plurality of operand signals; multiplexing between an intermediate carry-out signal and an operand signal for output as the carry-out signal under the control of the first multiplexing step.

18. The method of claim 14 further comprising the step of programmably providing the carry-out signal to a CLB in the first or second columns.

* * * * *